United States Patent [19]
Fredrickson

[11] Patent Number: 5,485,472
[45] Date of Patent: Jan. 16, 1996

[54] TRELLIS CODES WITH ALGEBRAIC CONSTRAINTS FOR INPUT RESTRICTED PARTIAL RESPONSE CHANNELS

[75] Inventor: Lisa Fredrickson, Sunnyvale, Calif.

[73] Assignee: International Business Machines Corporation, Armonk, N.Y.

[21] Appl. No.: 242,942

[22] Filed: May 16, 1994

[51] Int. Cl.⁶ .................................................. G06F 11/10
[52] U.S. Cl. ........................................ 371/43; 360/40
[58] Field of Search ............................. 371/43, 45, 44; 360/40

[56] References Cited

U.S. PATENT DOCUMENTS

| | | | |
|---|---|---|---|
| 4,888,775 | 12/1989 | Karabed et al. | 371/43 |
| 4,888,779 | 12/1989 | Karabed et al. | 371/43 |
| 5,042,036 | 8/1991 | Fettweis | 371/43 |
| 5,150,381 | 9/1992 | Forney, Jr. et al. | 375/39 |
| 5,257,272 | 10/1993 | Fredrickson | 371/43 |
| 5,280,489 | 1/1994 | Fredrickson et al. | 371/45 |
| 5,349,589 | 9/1994 | Chennakeshu et al. | 371/43 |

OTHER PUBLICATIONS

Blahut, Richard E., Theory And Practice Of Error Control Codes, Addison–Wesley Publishing Company, Inc., 1983, p. 172.

*Primary Examiner*—Paul P. Gordon
*Attorney, Agent, or Firm*—Henry E. Otto, Jr.

[57] ABSTRACT

A method for constructing trellis codes and an apparatus for providing trellis codes with increased minimum distance between output sequences of partial response channels with constrained inputs. A Viterbi detector expands a conventional trellis structure for the channel incorporating additional states interconnected such that a preselected function associates each state in the trellis with an algebraic evaluation of a polynomial at a particular element of a finite field. The detector trellis is time-varying such that only certain values of the preselected function are allowed every m bits. The time-variation assures that there are no minimum distance extensions of erroneous sequences beyond a predetermined length in the trellis. Reliability of storage channels is desirably increased, because more noise is required to overcome the additional distance and cause an error in distinguishing the correct encoded sequence.

20 Claims, 10 Drawing Sheets

TRELLIS CODES WITH ALGEBRAIC CONSTRAINTS FOR INPUT RESTRICTED PARTIAL RESPONSE CHANNELS

FIELD OF THE INVENTION

This invention relates to methods and apparatus for transmitting binary digital data over partial response channels. More particularly, it relates to a method and apparatus, using high rate modulation runlength limited codes and associated encoders and maximum likelihood detectors, for improving the reliability of data storage devices by using trellis codes with algebraic constraints to increase the minimum distance between output sequences of partial response channels with constrained inputs.

BACKGROUND OF THE INVENTION

The following prior art references are considered by applicant to be the most pertinent to the present invention:

[A] U.S. Pat. No. 4,888,779, granted Dec. 19, 1989, entitled "Matched Spectral Null Trellis Codes For Partial Response Channels."

[B] U.S. Pat. No. 5,257,272, granted Oct. 26, 1993, entitled "Time-Varying Modulo N Trellis Codes For Input Restricted Partial Response Channels."

[C] U.S. Pat. No. 5,280,489, granted Jan. 18, 1994, entitled "Time-Varying viterbi Detector For Control Of Error Event Length."

[D] Commonly assigned U.S. application Ser. No. 08/174, 904, filed Dec. 24, 1993 (pending), entitled "Permuted Trellis Codes For Input Restricted Partial Response Channels."

Partial response channels of interest for data storage devices include those with channel polynomials of the form $P(D)=(1-D^n)$ or $(1+D^n)$, where n is a nonnegative integer. Channels with this form have a practical implementation advantage in that they can be de-interleaved into n separate $(1-D)$ channels or n separate $(1+D)$ channels, respectively.

Reference [A] discloses a method for increasing the reliability of partial response storage channels by increasing the minimum distance between coded output sequences using so-called matched spectral null (MSN) trellis codes designed to match the spectral nulls in a channel partial response polynomial. The viterbi detectors in Reference [A] reduce complexity by tracking only the spectral content of detected sequences.

The "minimum distance" of a particular detector trellis (sometimes referred to in the art as $d^2_{free}$) is defined as the minimum sum of the squared differences between sequences of noiseless sample values resulting from two distinct paths that diverge from a common state on the trellis and remerge to a common state. For partial response, maximum likelihood (PRML) detection, the minimum distance is 2; but the first-order matched-spectral null codes of Reference [A] increase the minimum distance to 4. In order to realize the benefits of increased minimum distance in a Viterbi detector with finite path memory, it is required that any pair of sequences consisting of a coded sequence and another detector trellis sequence accumulate the distance within a finite number of samples. If the code contains "quasi-catastrophic" sequences, which are defined as sequences that are represented by more than one distinct path through the detector trellis, the minimum distance will not be accumulated in a finite number of samples, so it is necessary for the code to avoid such sequences. Reference [A] describes a method for eliminating quasi-catastrophic sequences.

Reference [B] describes a Viterbi detector which replicates a conventional trellis pattern for the desired channel N times. The N copies of the channel response trellis are interconnected in such a way that a preselected function associates each state in the trellis with a particular integer value modulo N. The number N is selected according to the channel detection and coding constraints so that diverging erroneous sequences of minimum distance lead to detector states which are distinct from the correct detector state. Only certain values of the preselected function tracked modulo N are allowed every m bits in order to increase the minimum distance between output sequences in the partial response channel and eliminate quasi-catastrophic sequences. The codes described in Reference [B] do not match the spectral nulls in the polynomial for the channel.

Reference [C] describes a Viterbi detector based upon a time-varying trellis structure for detection of codes with spectral nulls or spectral-density nulls. The trellis is obtained by selective deletion of states and edges from the trellis that tracks the spectral content of the output sequences. The time-varying structure provides for reduced error-event length by eliminating paths corresponding to certain quasi-catastrophic sequences. However, in order to maintain the desired high code rates, it was necessary to significantly increase the codeword block length or the number of trellis states, resulting in larger code and detector complexity.

Reference [D] describes sequences that are concatenated according to rules that depend upon the running digital sum (RDS) value of a sequence and that of its successor. The detector trellis structure combines subtrellises that track RDS or RDS modulo N, with reassignment of survivor metrics and survivor sequences at the subtrellis boundaries according to the sequence concatenation rules. The resulting detector trellis structure requires periodic permutation of states and hence is referred to as a "permuted trellis code." The sequences and the concatenation rules are selected to realize coding gain, eliminate quasi-catastrophic sequences from the detector trellis, limit the complexity of the maximum-likelihood detector, and improve runlength constraints relative to earlier proposed methods.

However, these references do not suggest (1) providing an encoder that imposes algebraic constraints upon a set of allowable code sequences to enable detection of specified error events; (2) providing a detector which (i) not only generates an estimate of a most probable binary sequence from a received sample, but also (ii) examines the detected sequence for violations of the algebraic constraints, and (iii) flags such violations to detect the occurrence of one of said specified error events; and (3) using an enlarged time-varying detector trellis to correct said error events.

SUMMARY OF THE INVENTION

An apparatus and method are described for improving reliability of a data storage device that transmits binary data as codewords over a partial response channel. An encoder constructs from the binary data a trellis code that imposes upon the codewords an algebraic constraint. This constraint is imposed as a predetermined algebraic attribute which identifies output sequences that differ from each other by at least one preselected error event.

A detector generates a most probable binary output sequence from codewords received from the channel. The detector tracks the algebraic attribute by iteratively computing from symbols sequentially output from a detector trellis the value of the algebraic attribute. The value of this attribute at the end of at least one codeword is used for flagging violations of the algebraic constraint and thereby detecting the occurrence any of the preselected error events. Allowable channel input sequences are constrained so that they will assume only a single value or set of values periodically in time at the end of a prespecified number of said symbols.

The detector trellis preferably is made time-varying to remove from the trellis all output sequences that fail to satisfy the preselected algebraic constraint for thereby correcting any of said preselected error events. If the channel is an uncoded partial response channel that includes a channel memory, the trellis is constructed to incorporate only a current state of the channel memory and a current state of the algebraic attribute. If the partial response channel uses an inner code and includes a channel memory, the trellis incorporates current states of the inner code, the channel memory and the algebraic attribute.

DESCRIPTION OF PREFERRED EMBODIMENTS

Preliminary Description

Figure 1:
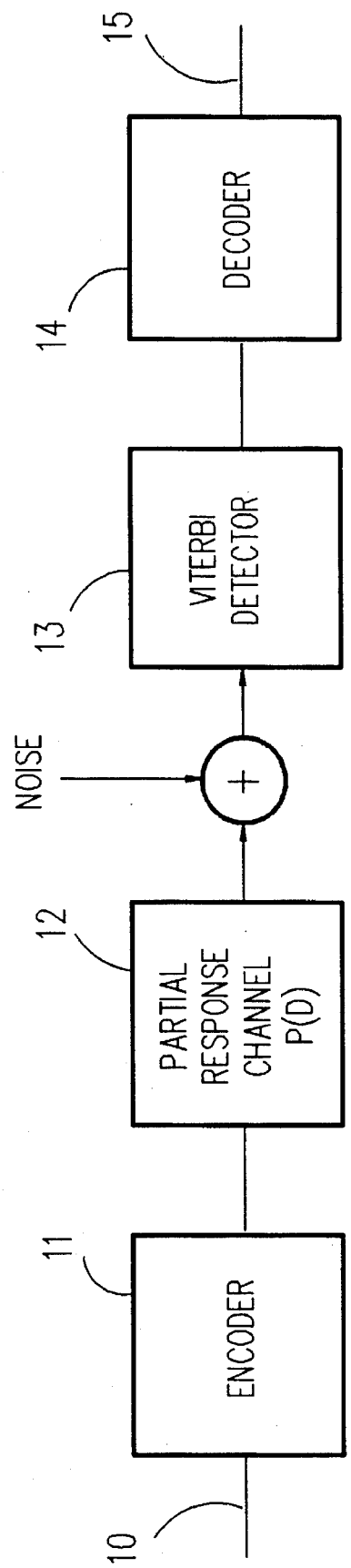
FIG. 1 is a block diagram of a data storage system embodying the invention comprising a modified encoder, a partial response channel, a modified Viterbi detector, and a decoder.

As depicted in FIG. 1, input data, such as in the form of binary symbol strings, is transmitted from a bus 10 to an encoder 11. According to the invention, encoder 11 comprises means (hereinafter described) to produce a binary code symbol sequence with algebraic constraints which serves as input to a partial response channel 12 with a system polynomial P(D) representing the channel memory. A channel output sequence is generated by partial response channel 12, corrupted by noise, and detected at the channel output by a modified viterbi detector 13 for implementing the invention. Detector 13 calculates and estimates, from the channel output sequence, the most probable coded sequence. A decoder 14 uses this estimate, as calculated by detector 13, to recover the original input data and output it to a bus 15.

According to a feature of the invention, detector 13 includes circuitry (hereinafter to be described) for examining the detected sequence for violation of the algebraic constraints imposed by encoder 11 and flagging such violations to detect the occurrence of a specified error event.

Trellis codes and Viterbi detectors are designed for uncoded partial response channels having characteristic polynomials of the form $P(D)=1 \pm D^n$, and for systems with an existing inner code for a partial response channel. Finite field arithmetic is utilized to associate each channel input sequence with the value of a corresponding channel input polynomial evaluated at a particular element in the finite field. The finite field and field element are chosen so that the difference in values associated with sequences forming minimum distance error events is a non-zero value. The interconnection of the conventional trellis pattern for the desired channel is replicated to produce a modified detector trellis in which each state is associated with a value, determined in finite field evaluation, of channel input sequences leading to that state.

The encoder 11 and detector 13 preferably are made time-varying, as taught in References [B], [C] and [D], in such a way that only certain polynomial values are allowed every m bits. The encoder 11 provides this time variation by appending redundant channel input bits so that the polynomial evaluation of the channel input bit stream results in one of the allowed values every m bits. The allowed values are chosen so as preclude the extension of erroneous sequences at the minimum distance beyond a predetermined length. In this manner, the reliability of storage channels is desirably increased, because more noise is required to overcome the additional distance and cause an error in distinguishing the correct coded sequence.

For each partial response channel polynomial herein considered, the state of the channel memory consists of the most recent j NRZ channel input bits, where j is the degree of the partial response polynomial. In a baseline system comprising a partial response channel and an inner channel code, the system state consists of the combined states of the channel memory and inner code.

Trellis sequences and error events are conveniently represented in D-transform notation, where D is the unit delay operator. For example, an encoded sequence c of length n is represented by the polynomial $$c(D) = \sum_{i=0}^{n-1} c_i D^i \qquad (1)$$

and a trellis-supported sequence t of length n is represented by $$t(D) = \sum_{i=0}^{n-1} t_i D^i. \qquad (2)$$

The error sequence e corresponding to their difference is represented by the difference polynomial $$e(D) = c(D) - t(D) = \sum_{i=0}^{n-1} e_i D^i, \qquad (3)$$

where $e_i = c_i - t_i$.

For the dicode partial-response channel, $P(D)=(1-D)$, a minimum distance 2 error event of length r corresponds to an input difference sequence polynomial of the form $$e(D) = \pm D^p \sum_{i=0}^{r-1} D^i, \quad (4)$$

If the channel input sequences are constrained to have no more than k+1 consecutive symbols with the same value, then r≤k+1.

A next minimum distance (i.e., distance 4) error event corresponds to an input difference polynomial of the form $$e(D) = \pm D^p \sum_{i=0}^{r-1} D^i \pm D^q \sum_{i=0}^{s-1} D^i, \quad (5)$$

where r and s are the numbers of consecutive bits where they differ in two distinct minimum distance 2 error events. This implies that q>p+r in order for the two events to be distinct.

The first order spectral-null codes of Reference [A] for the dicode channel require that all input error events be dc-free; that is, e(1)=0. The coded system has minimum distance input error events of the form $$e(D) = \pm D^p(D^q - 1) \sum_{i=0}^{r-1} D^i, (6)$$

where q≥r.

Similarly, Reference [B] requires that all input error events are dc-free modulo N.

DETAILED DESCRIPTION

According to the invention, trellis codes are constructed using an encoder 11 (hereinafter described in connection with FIG. 9) that adds redundancy to impose algebraic constraints to permit identification of specified input error events (e.g., minimum distance) at the output of the partial response channel 12. The improved Viterbi detector 13 has a circuit (hereinafter described in connection with FIG. 10) that, during the detection process, tracks the algebraic properties of the detector output sequences from the improved Viterbi detector 13 and is capable of flagging violations of the algebraic constraints, effectively detecting the occurrence of one of the specified input error events in the trellis. To correct the specified input error events, the trellis of the detector 13 is enlarged and preferably made time-varying to reflect the algebraic constraints on the encoded sequences.

The invention will be described, for sake of illustration, as applied to a partial response dicode (1−D) channel. However, the invention may also be applied to partial response channels having different channel polynomials by executing the following steps:

A. Select the error events supported by the baseline system that are to be flagged (e.g., minimum distance events and/or next minimum distance).

For example, Expressions (4) and (5) characterize the D-transforms of minimum-distance input error events (with minimum distance 2) and next-minimum-distance input error events (with minimum distance 4), respectively, for the uncoded, binary dicode channel. Expression (6) characterizes the minimum-distance input error events (with minimum distance 4) for the matched-spectral-null (MSN) coded, binary dicode channel.

B. Select an algebraic attribute to be tracked to that will distinguish from one another the channel output sequences that differ by one of the selected error events. For example, the attribute may be defined by evaluating the polynomial in Expression (2) with D=α, where α lies in a finite field GF[q] and the values of Expression (3) with D=α for all specified error events are non-zero.

If preferred, other algebraic systems may be used that, like a finite field GF[q], include elements that can be multiplied and added; e.g., a ring of integers modulo N when using these other algebraic systems, the method described above also distinguishes sequences that can form an error event in the specified set by evaluating the D-transform-polynomial of said sequences at D=α.

To reduce complexity of a hardware implementation, the finite field or ring of integers modulo N should be the smallest one that provides that evaluation of all specified error events results in a non-zero value.

C. In order to detect the preselected error event(s), constrain allowable input sequences to lie in a trellis code which restricts the range of values of the tracked attribute at the end of each codeword of length n. This can be done by adding parity symbols to a preselected number of channel input symbols of the baseline system or by directly selecting sequences to form codewords of length n, thereby preventing any pair of the encoded input sequences from differing by one of the selected error events. This constraint increases the minimum distance between the encoded output sequences.

Admissible values c(α) for encoded input sequences c are prescribed by introducing some additional redundancy in the specification of the code constraints. Usually the allowable encoded input sequences are constrained so that c(α) will assume only a single value periodically at the end of each sequence of L symbols. This permits detection of the targeted error events e(D) by iterative computation of c(α) for detector output sequences c(D). When this step is executed, the selected error event will have been detected.

D. Enlarge the detector trellis to incorporate into the states of the trellis the allowable values of the tracked algebraic attribute.

The trellis underlying the baseline system is enlarged so that the states of the modified trellis reflect the partial response channel memory (i.e., in a dicode channel, for example, whether the last code bit value was 0 or 1), as well as the allowable values obtained by evaluating encoded input sequences c(D) at D=α. From the choice of GF[q] and α in step B, it follows that the paths in the enlarged trellis corresponding to the specified error events (such as minimum-distance events) will end in distinct states. This applies to both uncoded and inner coded partial response channels, as follows:

(a) For an uncoded partial response channel of the form (1±D), the trellis incorporates both the state of the channel memory and the state of the tracked algebraic attribute, thereby increasing the number of trellis states.

(b) For a partial response channel of the form (1±D) that uses an inner code, incorporate into the trellis both the states of the inner code, including channel memory, and the state of the tracked algebraic attribute.

E. Preferably introduce periodic time-variation into the trellis to remove from the enlarged trellis all sequences that do not satisfy the constraint on the value of the tracked attribute at the end of each codeword.

By eliminating certain states and interconnections in the enlarged trellis, it is possible to eliminate the trellis sequences t(D) that produce an inadmissible value t(α) at the end of any sequence of L symbols. AS a result, the trellis will not support any sequence differing from a code sequence by any one of the selected error events. This effectively corrects the associated error-events e(D), permitting the detector performance to reflect the enhanced distance properties of the modified coded system.

To incorporate the selected algebraic constraint into the trellis requires tracking the values $$u(D) = \sum_{i=0}^{n-1} u_i D^i, \quad (7)$$

evaluated at $D=\alpha \in GF[q]$, where u denotes a channel input sequence.

For the specific code constructions hereinafter described, it suffices to know when $u_1(\alpha) \neq u_2(\alpha)$, and hence one can equivalently track the values $$\tilde{u}(D) = \sum_{i=0}^{n-1} u_i D^{n-1-i}, \quad (8)$$

evaluated at $D=\alpha^{-1} \in GF[q]$. This is verified by noting that $$\tilde{u}(\alpha^{-1}) = \sum_{i=0}^{n-1} u_i \alpha^{i+1-n} = \alpha^{-n+1} \sum_{i=0}^{n-1} u_i \alpha^i = \beta u(\alpha), \quad (9)$$

for some element $\beta \neq 0$.

Then Horner's rule, as stated in "Theory and Practice of Error Control Codes", by Richard Blahut, at page 172, is used to evaluate $\tilde{u}(D)$:

$$\tilde{v}(D) = (\ldots (u_0 D + u_1) D + u_2) + \ldots) D + u_{n-1}. \quad (10)$$

If v denotes the sequence obtained from u by appending the next symbol $u_n$, then $$\tilde{v}(D) = \tilde{u}(D) D + u_n. \quad (11)$$

This formula is used to generate the enlarged trellis from the baseline trellis.

Trellis Codes With Algebraic Constraints

I

Figure 2:
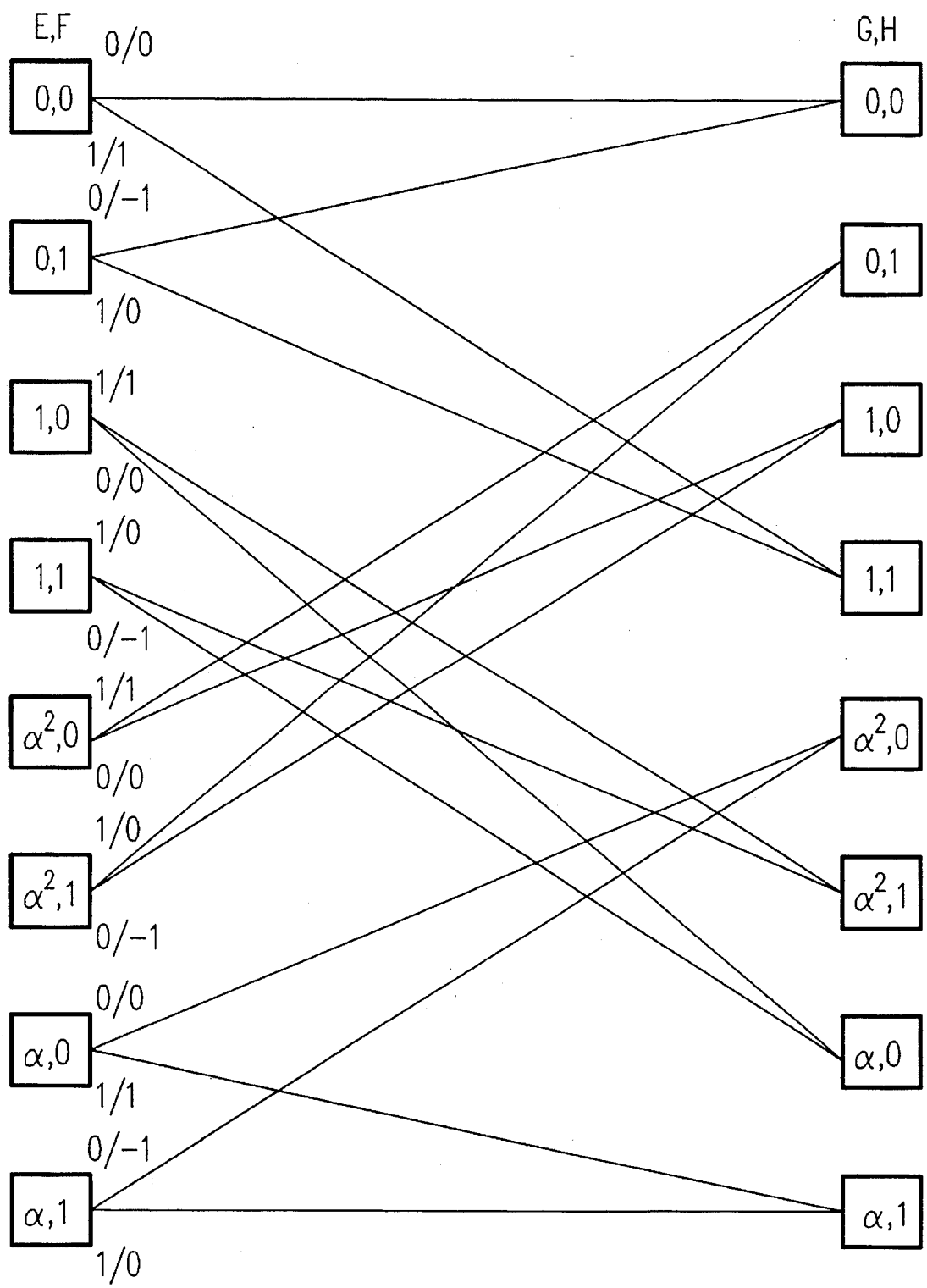
FIG. 2 is a trellis incorporating a dicode (1−D) channel memory and an algebraic tracked attribute over a Galois field GF[4].

The following examples illustrate the incorporation of a tracked algebraic attribute into a trellis:

As a first example, evaluate the polynomial in Expression (8) in a GF[4] decoder trellis, with $D=\alpha$, a root of $M(x)=x^2+x+1$. Construct an eight-state detector 13, with each state in the detector associated with a particular value of channel memory and a particular value of $\tilde{u}(\alpha)$ in GF[4]. The interconnection of the states of the trellis is shown in FIG. 2. Each state in FIG. 2 is labelled E, F, where E is the most recent value of $\tilde{u}(\alpha)$ and F is the most recent value of channel memory. Each branch or edge in FIG. 2 is labeled G/H, where G is the channel input bit in NRZ notation and H is the ideal noiseless sample value. For example, in FIG. 2, there are two branches leaving the state $\alpha^2,1$. The successor states are obtained by multiplying the current value of Expression (8) by $\alpha$, and adding the most recent input bit. Since $\alpha(\alpha^2)=\alpha^3=1$, the successor state for state $\alpha^1,1$ is given by $(1+u_n),u_n$ where the addition is computed using field arithmetic. Under the hypothesis that $u_n=0$, the successor state is 1,0; for $u_n=1$, the successor state is 0,1.

Figure 3:
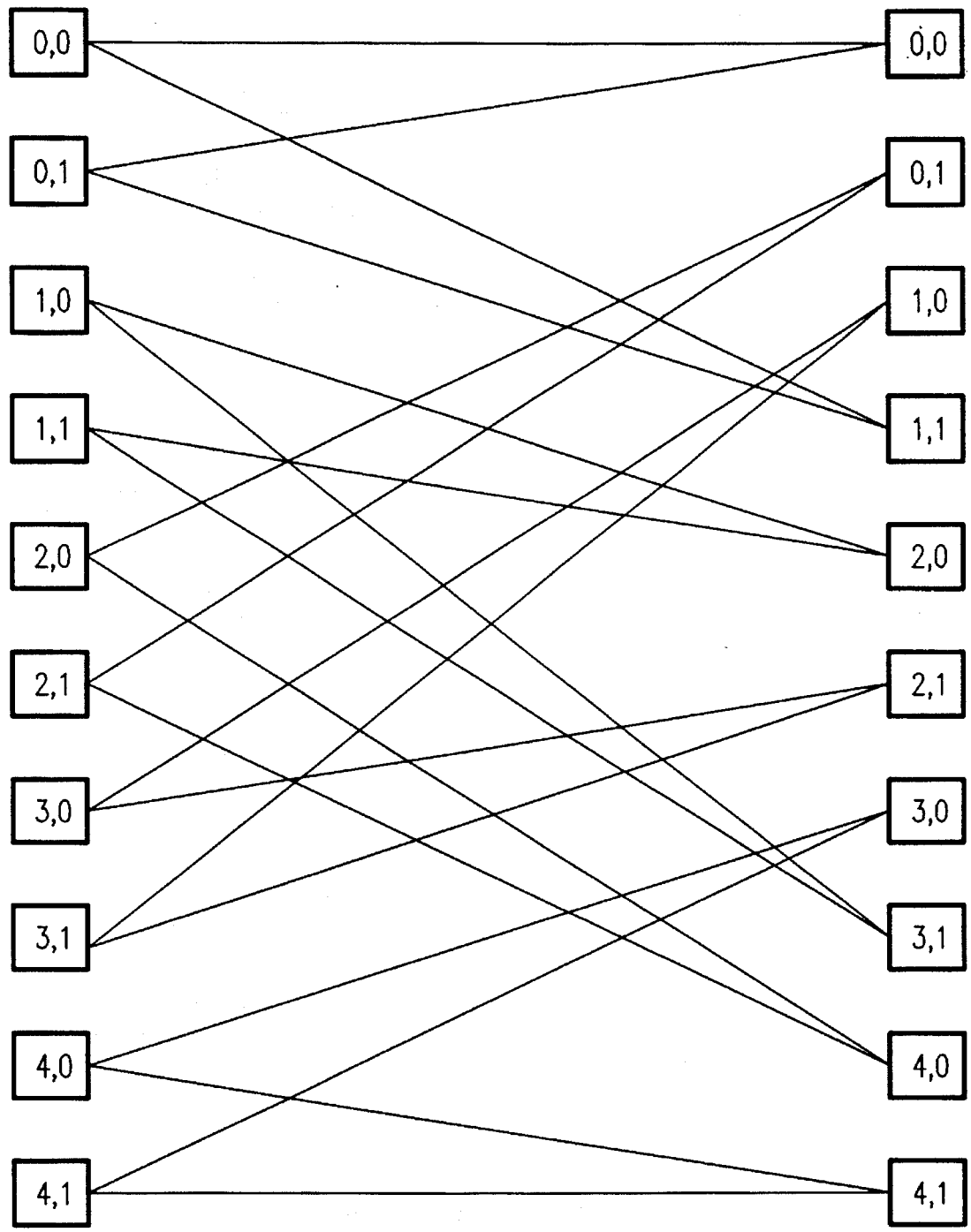
FIG. 3 is a trellis incorporating a dicode channel memory and an algebraic tracked attribute over a Galois field GF[5].

As a second example, evaluate the polynomial in Expression (8) in a GF[5] decode trellis, with $D=\alpha=2$. A ten-state detector 13 is constructed, with each state in the detector associated with a particular value of channel memory and a particular value of $\tilde{u}(2)$ in GF[5]. The interconnection of the states of the trellis is shown in FIG. 3. Each state in FIG. 3 is labelled E,F where E is the most recent value of $\tilde{u}(2)$ and F is the most recent value of channel memory. The redundant branch labels have been omitted in FIG. 3. In FIG. 3, there are two branches leaving the state 4,1. The successor states are obtained by multiplying the current value of Expression (8) by 2, and adding the most recent input bit. Since $2(4)=8=3$ (modulo 5), the successor state is given by $(3+u_n)$, $u_n$ where the addition is computed using field arithmetic. Under the hypothesis that $u_n=0$, the successor state is 3,0; for $u_n=1$, the successor state is 4,1.

II

Figure 4:
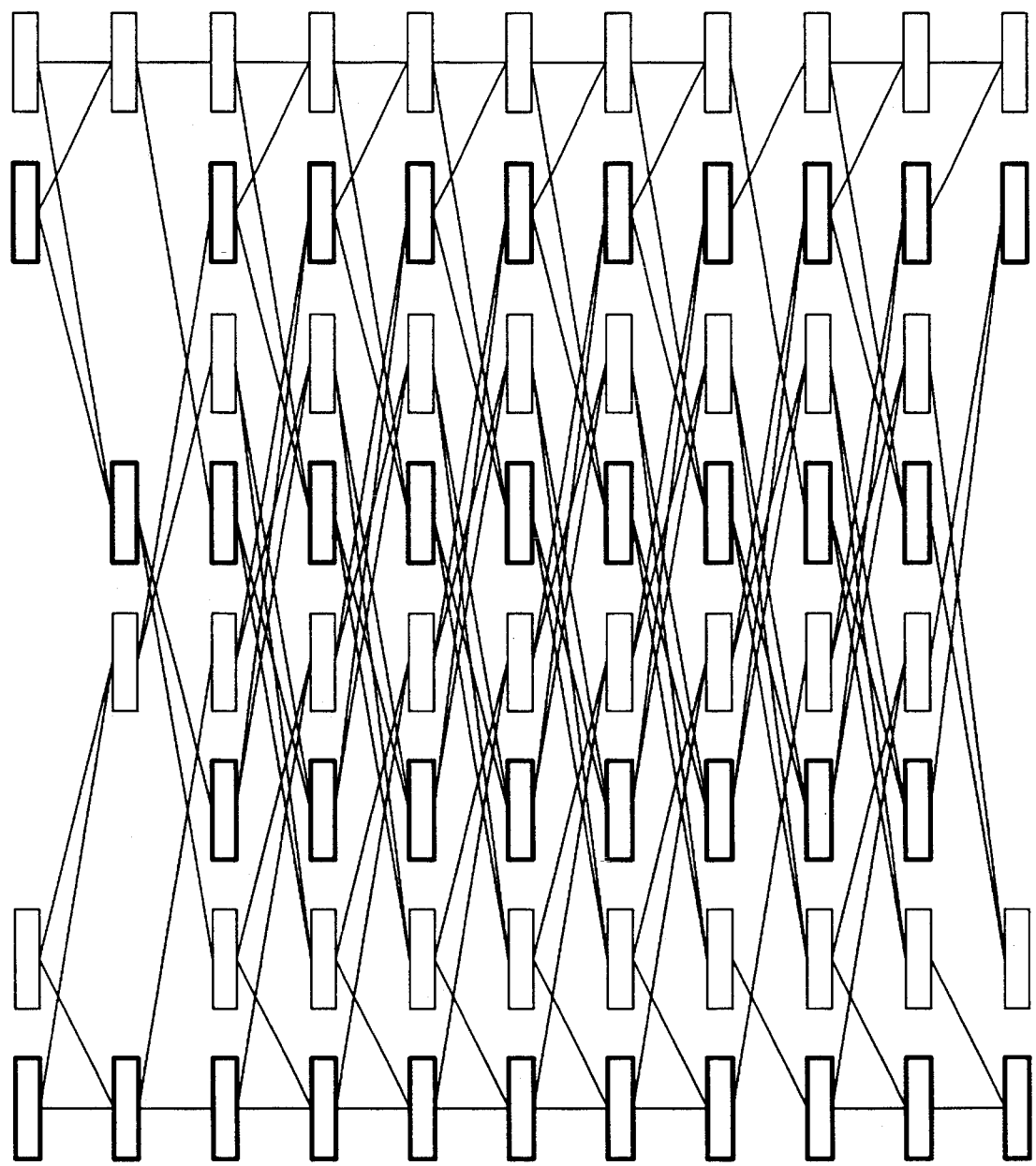
FIG. 4 is a rate 8/10 time-varying dicode trellis over GF[4] with a minimum distance of 4 and no quasi-catastrophic sequences.

The following examples illustrate the application of some known methods to create new algebraic trellis codes with minimum distance 4 when applied to the dicode (1−D) channel:

To produce a practical modulation code, the trellises should preferably be made time-varying and sequences should be selected to enhance minimum distance, to limit the maximum length of minimum distance error events, and to limit the allowed runlengths of consecutive same symbols, as taught by References [B], [C] and [D]. To produce a code with minimum distance 4, the detector must be relieved of the decision involved in an error event which may be incurred when choosing between a coded sequence and a trellis sequence with minimum distance 2. This can be achieved by adding additional logic to pre-bias the detector in these decisions to favor a particular member of each minimum distance 2 pair which is available for use in the code and/or by removing these decisions by eliminating sequences from the code. The time-varying trellis of FIG. 4 illustrates the former approach, while that of FIG. 5 eliminates these decisions by eliminating sequences from the code, using a permuted trellis.

In order to limit the maximum length of minimum distance error events, quasi-catastrophic trellis sequences are eliminated from the time-varying trellis. Pairs of quasi-catastrophic sequences which are runlength constrained must result from common input sequences and emanate from a pair of states with common channel memory.

Figure 5:
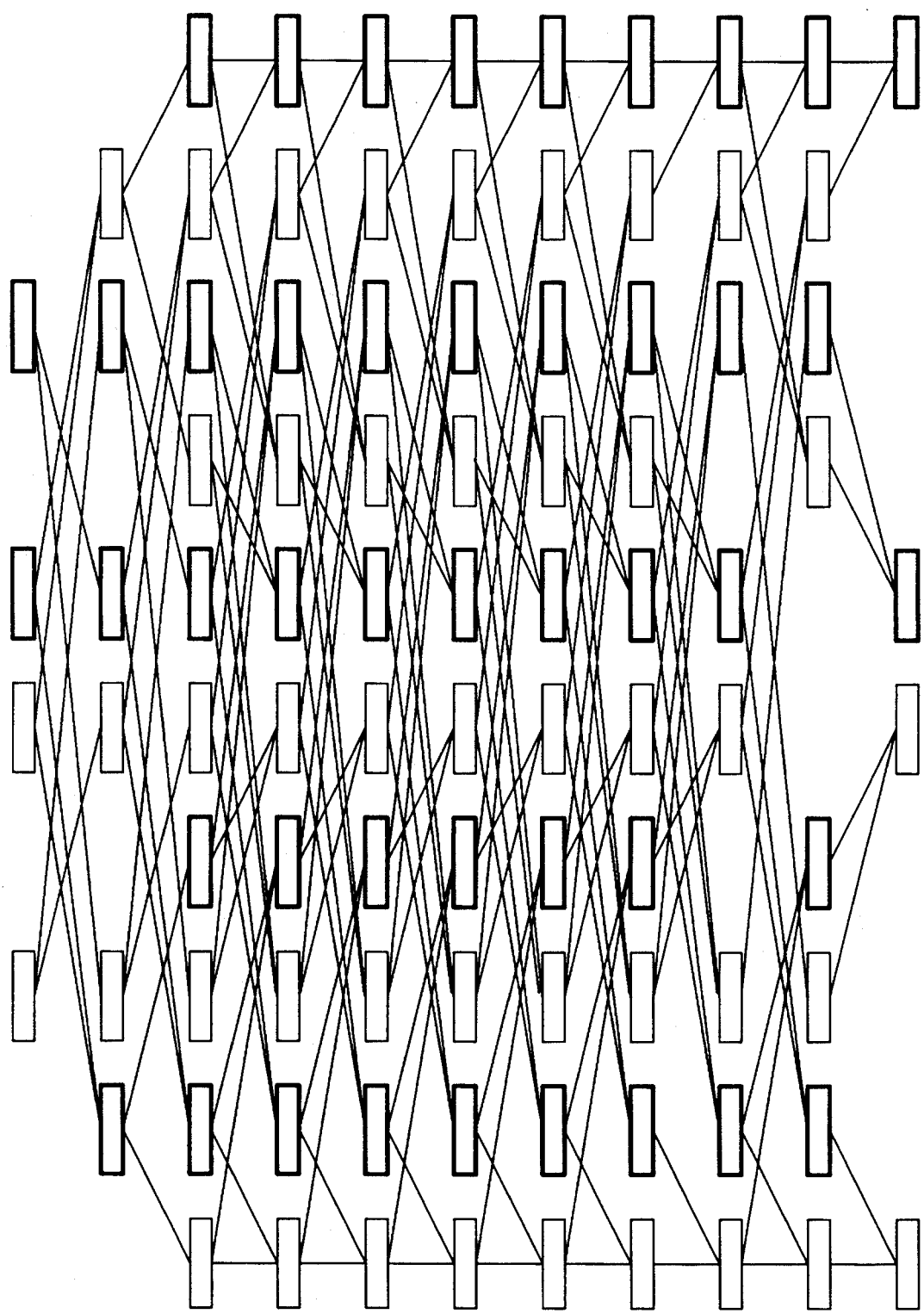
FIG. 5 is a permuted rate 8/10 time-varying dicode trellis over GF[5] with a minimum distance of 4 and no quasi-catastrophic sequences.

One method of eliminating quasi-catastrophic sequences allows pairs of states for each value of channel memory periodically in time. Let $x_0,x_1$ be the initial values of Expression (8) used as initial state labels for two such quasi-catastrophic sequences. If a common input sequence of length L bits is allowed from each of these states, then the values of Expression (8) will be $D^L x_0+y, D^L x_1+y$ after L bits where y is the common contribution to Expression (8) for the last L bits. The initial difference in state values, $x_0-x_1$, becomes $D^L(x_0-x_1)$. If the only pairs of states with a common value of channel memory after L bits have a difference in state values which is not equal to $D^L(x_0-x_1)$, this quasi-catastrophic behavior is eliminated. Reference C uses this method in an example of a time-varying MSN trellis, where D is 1 and the pairs of periodically allowed states have alternating adjacent and non-adjacent RDS values. FIGS. 4 and 5 herein use this method in time-varying trellises for codes over GF[4] and over GF[5] of rate 8/10.

Figure 6:
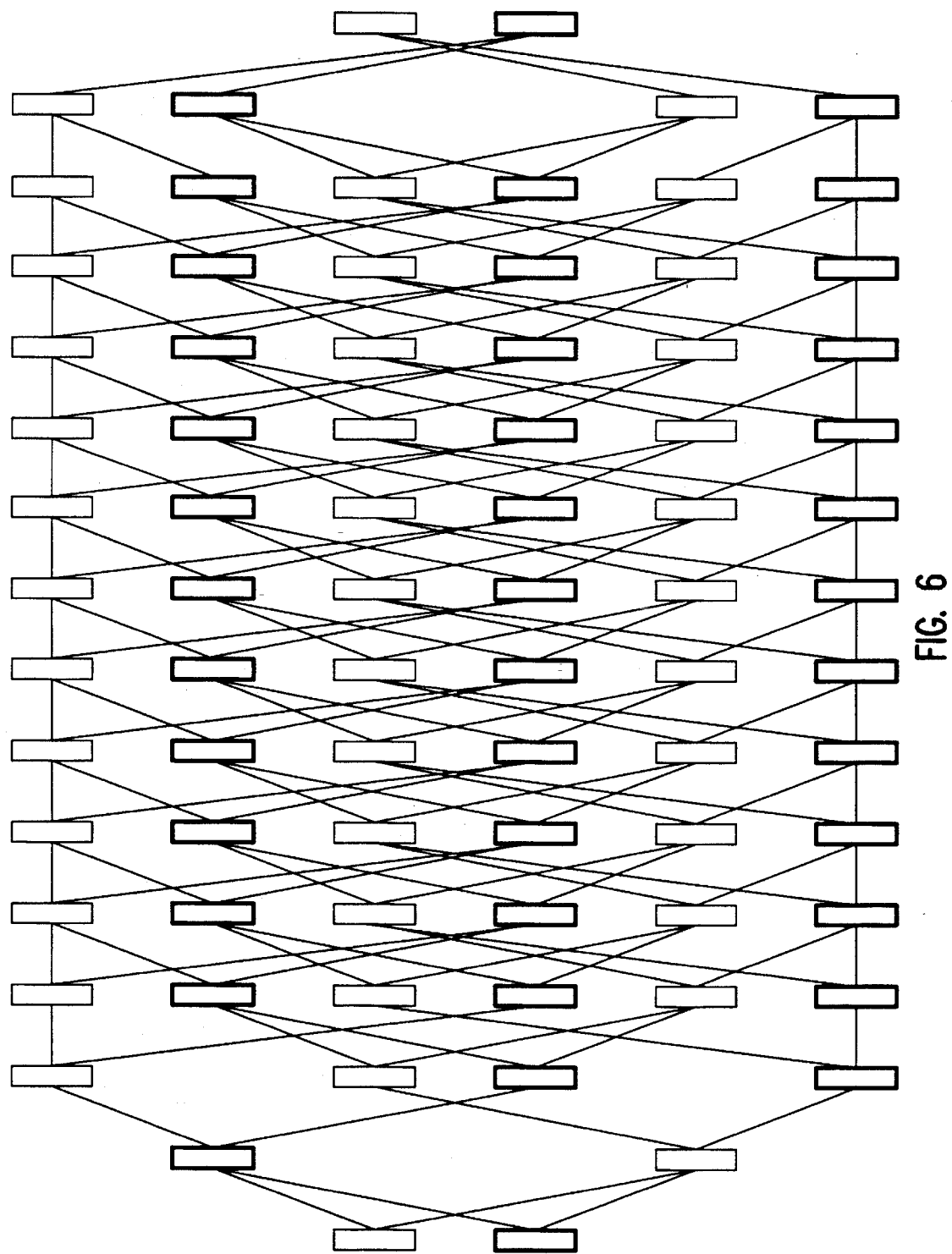
FIG. 6 is a rate 9/15 time-varying dicode trellis over GF[3] with a minimum distance of 4 and no quasi-catastrophic sequences.

Another method of eliminating quasi-catastrophic sequences is to allow only one state for each value of channel memory periodically in time. This is illustrated in FIG. 6, a time-varying dicede trellis for a rate 9/15 code over GF[3]. Each codeword used in the code for FIG. 6 contains runs of at most two consecutive same symbols.

According to the invention, an MSN trellis code is augmented in the following manner to increase the minimum distance of the code to at least 6 and to detect minimum distance 4 events in a baseline Viterbi detector. For the purposes of this description, the codewords of the MSN code will hereinafter be called blocks. If the code is not quasi-catastrophic, the length of minimum distance 2 divergent sequences is limited and divergent sequences which remerge with minimum distance 4 do so within L bits, where L is determined by the properties of the particular MSN code. Sequences c and t which remerge on an MSN trellis with minimum distance 4 are a special case of Expression (6), where (per Step A above) the polynomials for the events selected to be flagged are $$e(D) = \tag{12}$$

$$\pm \left( D^n \sum_{i=0}^{r-1} D^i - D^m \sum_{i=0}^{r-1} D^i \right) = \pm D^n (D^{n-m} - 1) \sum_{i=0}^{r-1} D^i.$$

If Expression (12) is evaluated (per Step B) over a finite field, then e(D) is non-zero provided that each of the three terms on the righthand side of Expression (12) is non-zero. If $D \ne 1$ in a finite field, $$\sum_{i=0}^{r-1} D^i = 0 \tag{13}$$

iff $$(1-D) \sum_{i=0}^{r-1} D^i = 1 - D^r = 0. \tag{14}$$

If $D=\alpha$ is a primitive element in a sufficiently large field GF[q], Expression (12) will be non-zero given the runlength constraints which bound r and the MSN minimum distance event lengths, which constrain n−m<L.

Then (per Step C) at least one redundant block is appended to a series of h blocks to ensure that every codeword of h+1 blocks has a defined algebraic value over GF[q]. Detector 13 includes circuitry, such as hereafter described, that calculates the value for each codeword of h+1 blocks, and declares that a minimum distance error has been detected if the defined value does not match.

By enlarging the detector trellis (per Step D) to incorporate the value of the tracked algebraic attribute, and by introducing time-variation in the enlarged trellis (per Step E) to reflect the constraint on the value of the tracked algebraic attribute at the end of each codeword of h+1 blocks, the system comprising the modified trellis code and the viterbi detector based upon the time-varying enlarged trellis effectively corrects the distance 4 events in the baseline system.

In a specific example, the MSN code is a rate 6/8 code where each eight-bit block is dc balanced, and minimum distance 4 events remerge within eight bits. Table 1 and all other tables hereinafter referred to are set forth in an APPENDIX hereto. Table 1 lists 68 possible blocks from which a nominal set of 64 blocks are chosen. These blocks are defined by a six-state time-varying trellis with a single allowed RDS value every eight bits, as shown in FIG. 7.

Figure 7:
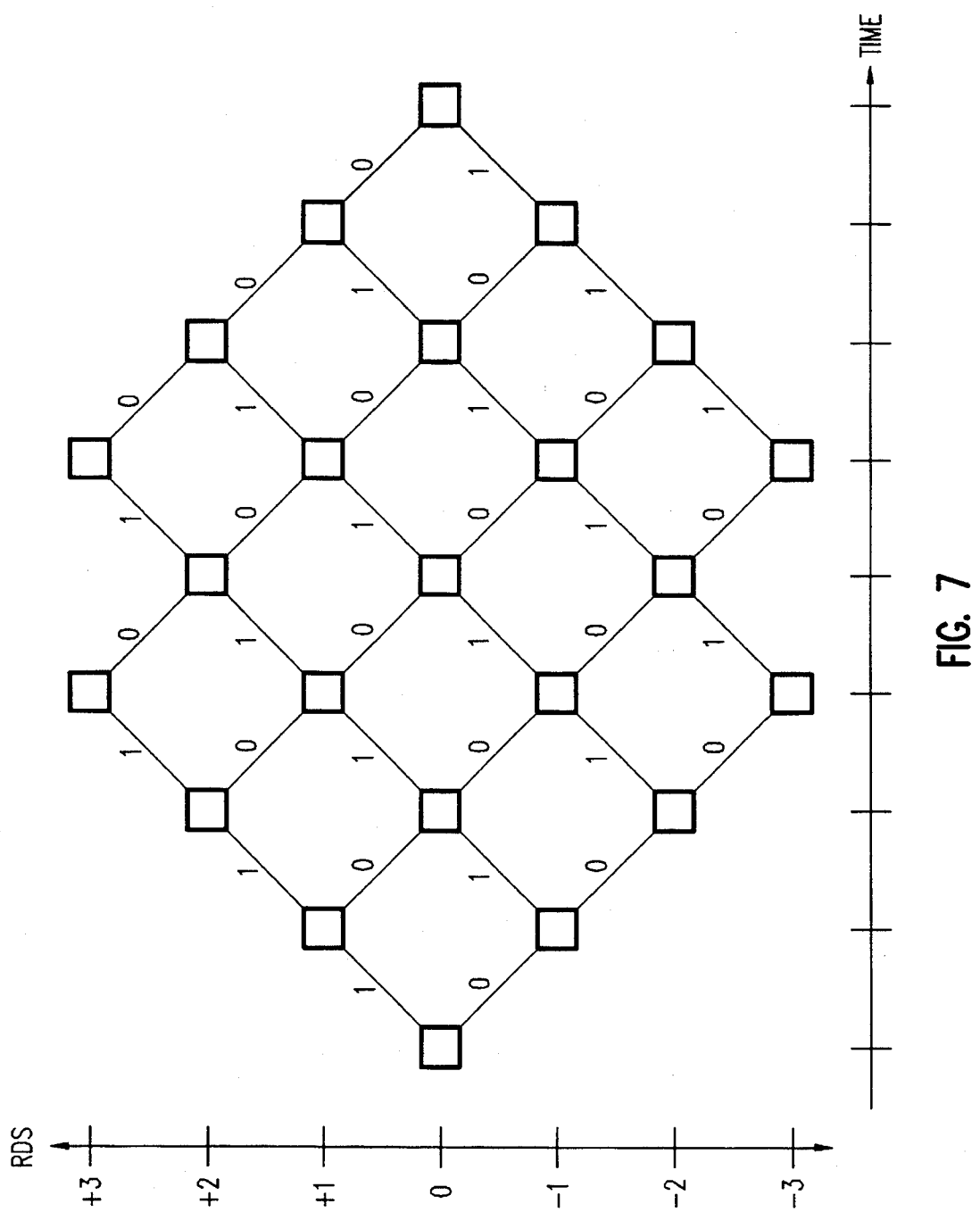
FIG. 7 is a diagram showing time-varying RDS constraints of a dc-balanced, rate 5/8 code.

A time-varying RDS trellis detector 13 incorporating channel memory and the inner code depicted in FIG. 7 is constructed, using the methods disclosed in Reference [C]. The time-varying RDS detector has at most six trellis states at any one time.

Figure 8:
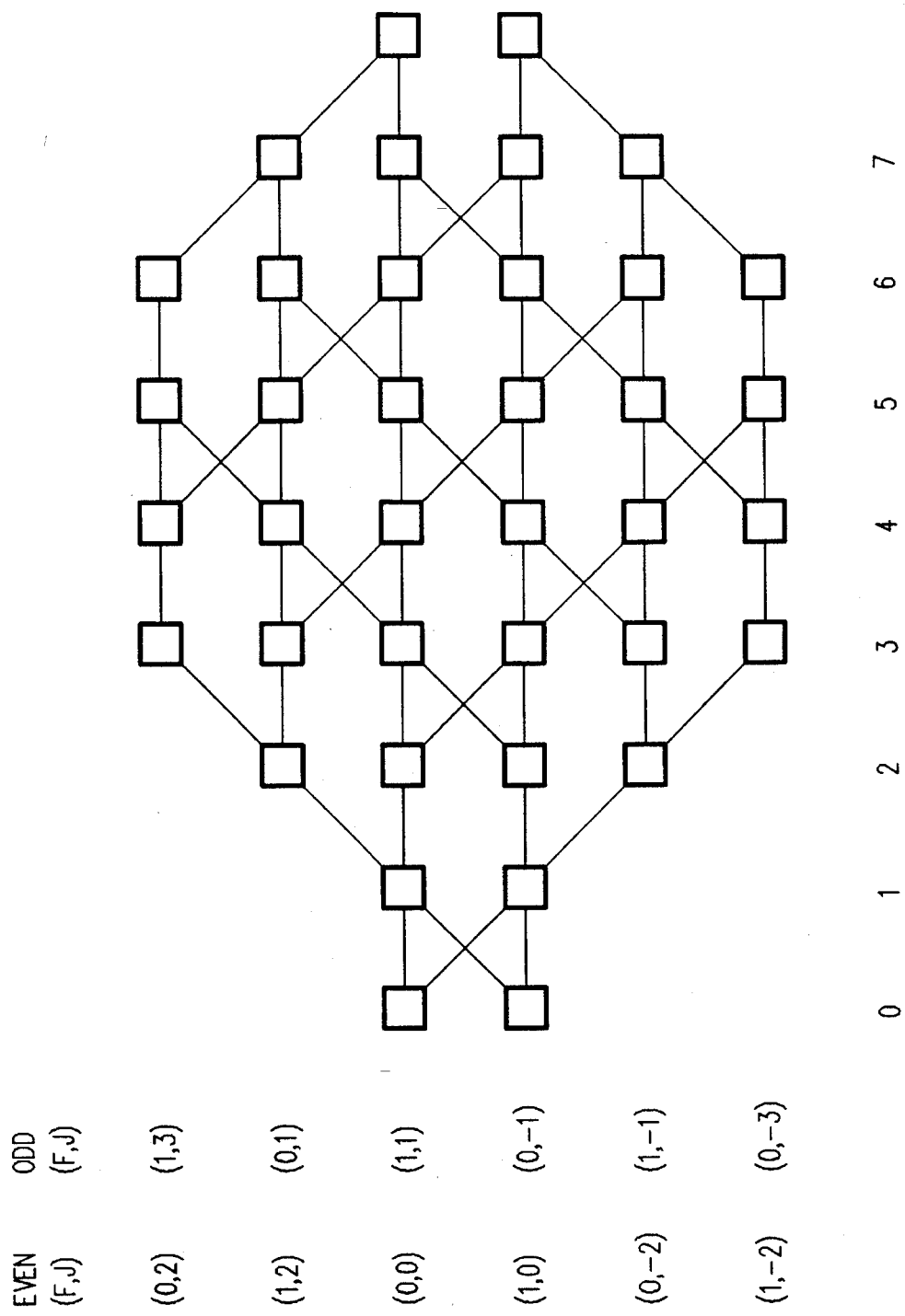
FIG. 8 is a detector trellis for the rate 5/8 code depicted in FIG. 7 for a dicode channel.

FIG. 8 shows the eight stages of the time-varying RDS detector trellis for time instants 0,1, . . . ,7. Each state in FIG. 8 is designated by (F, J) where F denotes the (1−D) channel memory taking value 0 or 1, and J denotes the RDS value. At even time instants, the RDS values are −2, 0, or 2; while at odd time instants, the RDS values are −3, −1, 1, or 3. The label G/H to be associated with an edge from state (F, J) to (F', J') is F'/(F'−F), where, as in FIG. 2, G is the channel input bit in NRZ notation and H is the ideal noiseless channel output sample value. The RDS values satisfy the relation $J'=J+(-1)^{F+1}$. In other words, the interconnections in the trellis satisfy the rule $(F,J) \to (F',J+(-1)^{F+1})$ for channel input bit F'.

It can be verified that the minimum distance between the channel output sequences represented in FIG. 8 is 4.

The output error events of minimum distance allowed (per Step A) by the detector trellis of FIG. 8 correspond to input error events of one of the forms $$e(D) = \pm D^m (D^n - 1), \tag{15}$$

where n=2,3,4,5,6 or 7, or $$e(D) = \pm D^m (D^n - 1)(D+1), \tag{16}$$

where n=3,4,5 or 6.

A Galois field GF[q] and an element β of GF[q] are sought (per Step B) such that the polynomial evaluation of e(β) over GF[q] is non-zero for all minimum distance error events. For this code, the field GF [9] is employed, where GF [9] is represented by polynomial residue classes modulo the primitive polynomial $$M(x) = x^2 + x + 2$$

with coefficients from GF [3] .

Assume β denotes the residue class of the polynomial x. Table 2, for convenience, lists the powers of β, as well as their representation in base 3. It may be directly verified that the polynomials for the error events listed above are non-zero when evaluated at D=β over GF[9]. Table 3 evaluates the polynomial in Expression (8) for the possible code sequences of the 6/8 code of Table 1 over GF[9], with the result of the evaluation shown in base 3 representation.

An additional block is appended (per Step C) to a series of h blocks by encoder 11, in the manner hereinafter to be described, to ensure that the value of the tracked attribute over GF[9] at the end of each codeword of h+1 blocks is zero (0). This eliminates all distance 4 error events from the resulting code, thereby increasing the minimum distance to 6.

In this specific example, for any given series of h blocks of the rate 6/8 code, there are four redundant blocks, any one of which may be appended to the series to force the algebraic attribute of the h+1 concatenated eight-bit blocks to a predefined value, illustratively assumed to be zero.

This implies that the rate of the trellis code is of the form $$R = \frac{6h+2}{8h+8}$$

where the numerator represents the total number of user bits, and the denominator represents the total number of encoded bits. Table 4 shows the redundant blocks as a function of the data polynomial evaluation in base 3 representation and two user bits.

For detecting minimum-distance error events, the detector 13 is enhanced, in the manner hereinafter described, with a circuit that tracks the algebraic attribute in GF[9], comparing the tracked attribute value at the end of each codeword of h+1 consecutive detected blocks to the predefined value 0.

The enlarged trellis is obtained (per Step D) by interconnecting nine copies of the 6/8 code trellis depicted in FIG. 8 to form a 54-state trellis (not shown, but described below). Each state in the trellis is labelled with a 3-tuple indicating the most recent channel memory, the value of RDS, and the value of the algebraic attribute calculated over GF[9]. The trellis is made time-varying (per Step E) to reflect the underlying structure of the 6/8 trellis code and also to admit only the predetermined value (0) over GF[9] at the end of each codeword of h+1 blocks. The modified, enlarged trellis therefore reflects the minimum distance 6 of the enhanced rate 6/8 code.

More specifically, to implement steps D and E, the states of the enlarged trellis are designated by (E,F,J), where F and J have the same meaning and range of values as in the baseline detector trellis shown in FIG. 8, and E is the tracked attribute value in GF [9]. The interconnections in the enlarged trellis satisfy the rule:

$$(E,F,J) \rightarrow^F (E \cdot \beta + F', F', J + (-1)^{(F+1)})$$

The coordinate value E·β+F' may be evaluated using Table 2.

The interconnections in the enlarged trellis must also be consistent with the time-varying restrictions imposed by the baseline detector trellis (which incorporates the rate 6/8 code constraints and channel memory) as well as the time-dependent constraint on the tracked attribute (which requires that the attribute takes the value E=0 at the end of each codeword of h+1 blocks).

The states of the first four stages of the enlarged 54-state trellis are shown by way of example in Table 5.

Figure 9:
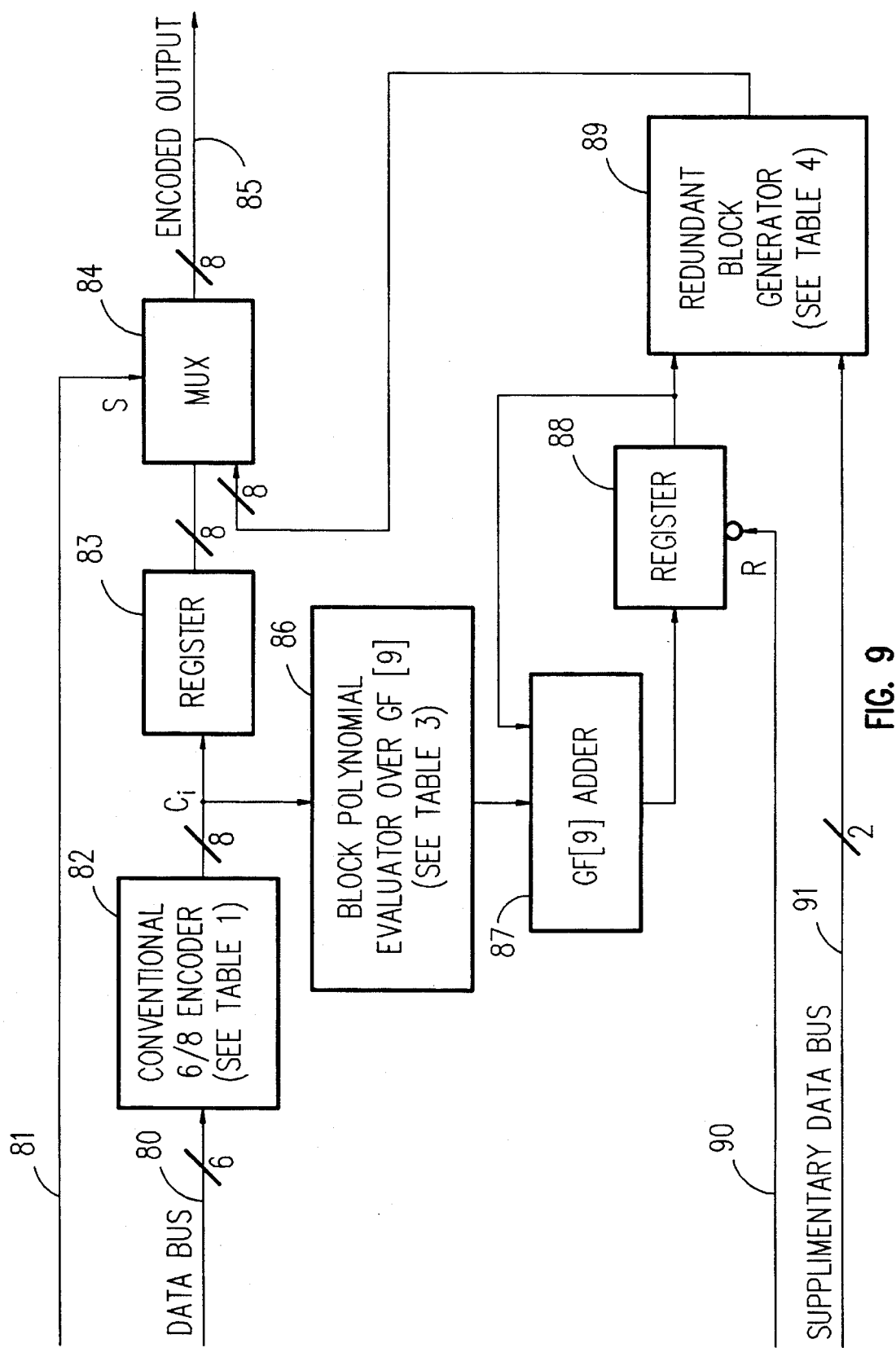
FIG. 9 is a schematic diagram of an encoder constructed according to the invention for trellis codes with rates of the form R=(6h+2)/(8h+8), and minimum distance 6 over a dicode channel.

As illustrated in FIG. 9, and according to the invention, encoder 11 comprises a conventional rate 6/8 encoder 82, a register 83, a multiplexor (MUX) 84, a block polynomial evaluator 86 over GF[9], a GF[9] adder 87, a register 88, and a redundant block generator 89. The encoder 82, evaluator 86 and generator 89 may be implemented in logic or, as herein illustrated, as the read only memory (ROM) contained in Tables 1, 3 and 4, respectively.

A six-bit user data bus 80 conveys six-bit data words to the conventional rate 6/8 encoder 82 that generates for each six-bit word a unique eight-bit block $c_i$ from those listed in Table 1. Each block thus generated is stored in register 83 and is also supplied to block polynomial evaluator 86. Evaluator 86 generates for each block a unique value of the algebraic attribute in GF[9], as specified in Table 3. The GF[9] adder 87 combines this unique value of the algebraic attribute with the accumulated value of the algebraic attribute fed back from register 88.

Encoder 82 encodes h successive six-bit data words, and passes the generated eight-bit blocks via register 83 to MUX 84. MUX 84 is conditioned by a signal in line 81 to pass the encoded eight-bit blocks to encoded output bus 85. After h successive data words have been encoded, two additional data bits are supplied via a secondary bus 91 to redundant block generator 89. The two data bits from bus 91 and the accumulated attribute value from register 88 are supplied to generator 89 which generates a redundant block in accordance with Table 4. This redundant block is supplied to MUX 84.

Control line 81 then supplies a complementary signal to MUX 84 that changes the state of the MUX to transmit the redundant block from generator 89 as an encoded output to bus 85. A reset signal is thereupon supplied via control line 90 to register 88 to reset its contents to value zero, thereby completing an encoding cycle for the rate (6h+2)/(8h+8) code.

Figure 10:
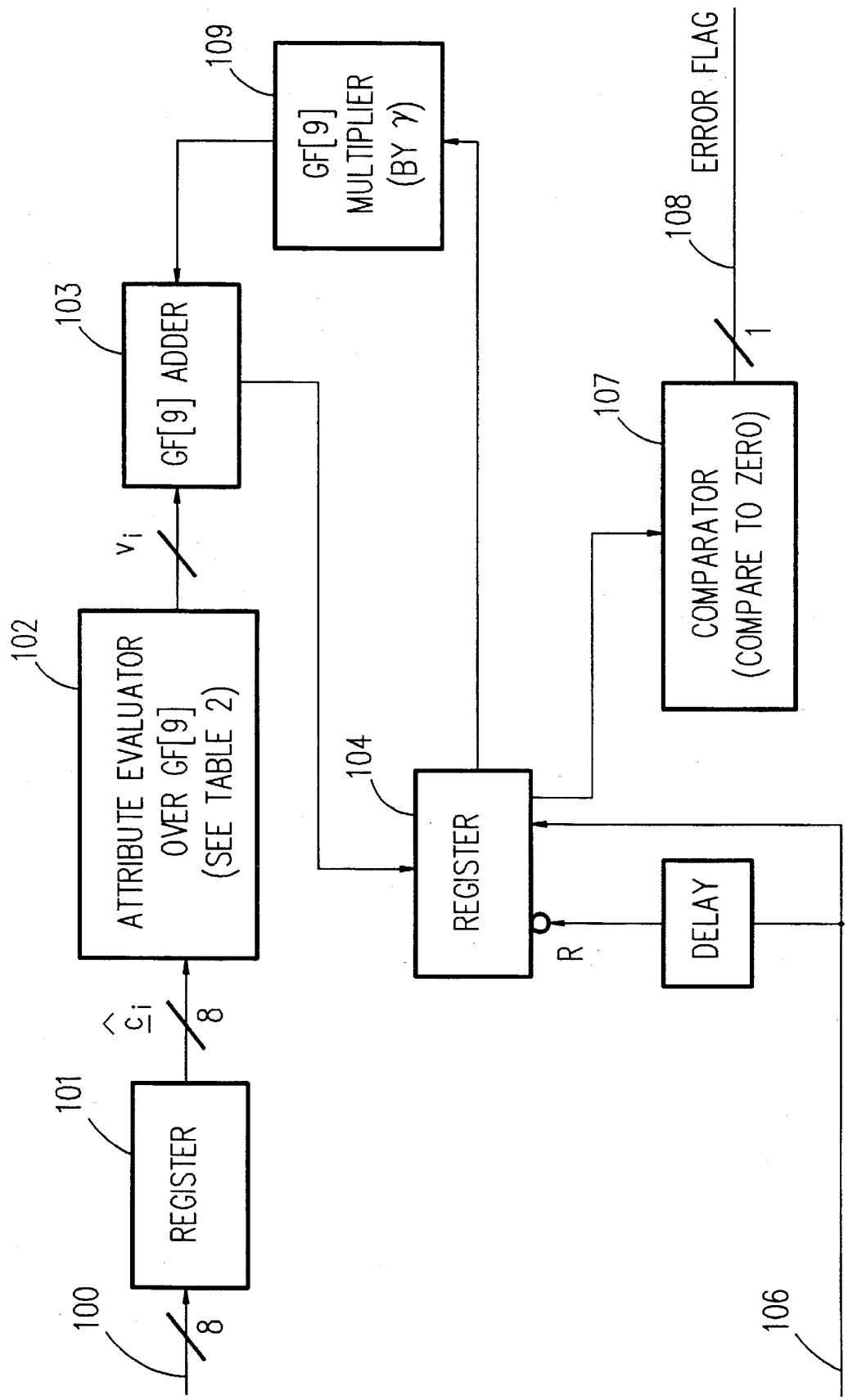
FIG. 10 is a schematic diagram of a circuit which evaluates the algebraic attribute of detected sequences and flags any violation of the algebraic constraints imposed by the encoder of FIG. 1.

As illustrated in FIG. 10, and according to the invention, detector 13 includes a circuit 99 for tracking the algebraic attribute value of the detected sequence and flagging any violation of the algebraic constraints imposed by encoder 11 for detecting an occurrence of a preselected error event.

Detected blocks $\hat{c}_i$, i=0, ..., h, received on bus 100 from Viterbi detector 13 are stored sequentially in register 101. Attribute evaluator 102 generates the value $v_i$ corresponding to the accumulated value in Table 3. This value $v_i$ is supplied as one input to GF[9] adder 103. Register 104 stores the value of the tracked algebraic attribute corresponding to previously detected blocks $\hat{c}_j$, j=0, ..., i−1. This tracked value is fed back via finite field multiplier 109 to provide the other input to adder 103.

After the accumulated value of the tracked attribute for the last of h+1 blocks is stored in register 104, that accumulated value is supplied to a comparator 107 (as illustrated, a compare-to-zero comparator) in response to a signal in line 106. Comparator 107 conveys the logical result of the comparison to an error flag line 108. The single-bit-signal in error flag line 108 has a logical value of zero if the accumulated attribute value equals zero (i.e., there is no violation of the algebraic constraint) and a value of 1 otherwise (i.e., there is a violation). A delayed signal from control line 106 then resets register 104 to zero.

Note that in the unique example just described, which uses a rate 6/8 code with a GF[9], the constant γ equals $\beta^8$, which equals 1 in GF[9]; and hence the fixed multiplier circuit 109 may be eliminated.

While the invention has been shown and described as applied to a dicode (1−D) channel, it will be understood by those skilled in the art that the invention may be applied to partial-response channels with different channel polynomials P(D), such as those mentioned above in the Background of the Invention section. Moreover, while it is preferable, as above described, to flag violations of the algebraic constraint after each codeword of 8h+8 bits, violations may, if desired, be flagged after each series of any preselected number of codewords. Also, various changes in form and detail may be made in the disclosed embodiments without departing from the spirit, scope and teaching of the invention. Accordingly, the invention herein disclosed is to be considered merely as illustrative and limited in scope only as specified in the claims.

TABLE 1

| CODE SEQUENCES OF FIG. 7 | | | | | |
|---|---|---|---|---|---|
| 00010111 | 00011011 | 00011101 | 00011110 | 00100111 | 00101011 |
| 00101101 | 00101110 | 00110011 | 00110101 | 00110110 | 00111001 |
| 00111010 | 00111100 | 01000111 | 01001011 | 01001101 | 01001110 |
| 01010011 | 01010101 | 01010110 | 01011001 | 01011010 | 01011100 |
| 01100011 | 01100101 | 01100110 | 01101001 | 01101010 | 01101100 |
| 01110001 | 01110010 | 01110100 | 01111000 | 10000111 | 10001011 |
| 10001101 | 10001110 | 10010011 | 10010101 | 10010110 | 10011001 |
| 10011010 | 10011100 | 10100011 | 10100101 | 10100110 | 10101001 |
| 10101010 | 10101100 | 10110001 | 10110010 | 10110100 | 10111000 |
| 11000011 | 11000101 | 11000110 | 11001001 | 11001010 | 11001100 |
| 11010001 | 11010010 | 11010100 | 11011000 | 11100001 | 11100010 |
| 11100100 | 11101000 | | | | |

TABLE 2

| POWERS OF β | | |
|---|---|---|
| i | $\beta^i$ | representation in base 3 |
| 1 | x | 10 |
| 2 | 2x + 1 | 21 |
| 3 | 2x + 2 | 22 |
| 4 | 2 | 02 |
| 5 | 2x | 20 |
| 6 | x + 2 | 12 |
| 7 | x + 1 | 11 |
| 8 | 1 | 01 |

TABLE 3

POLYNOMIAL EVALUATION OF 6/8 CODE SEQUENCES OVER GF[9]

| Sequence | Polynomial Evaluation (base 3 representation) |
|---|---|
| 00010111 | 01 |
| 00011011 | 02 |
| 00011101 | 10 |
| 00011110 | 22 |
| 00100111 | 22 |
| 00101011 | 20 |
| 00101101 | 01 |
| 00101110 | 10 |
| 00110011 | 00 |
| 00110101 | 11 |
| 00110110 | 20 |
| 00111001 | 12 |
| 00111010 | 21 |
| 00111100 | 02 |
| 01000111 | 11 |
| 01001011 | 12 |
| 01001101 | 20 |
| 01001110 | 02 |
| 01010011 | 22 |
| 01010101 | 00 |
| 01010110 | 12 |
| 01011001 | 01 |
| 01011010 | 10 |
| 01011100 | 21 |
| 01100011 | 10 |
| 01100101 | 21 |
| 01100110 | 00 |
| 01101001 | 22 |
| 01101010 | 01 |
| 01101100 | 12 |
| 01110001 | 02 |
| 01110010 | 11 |
| 01110100 | 22 |
| 01111000 | 20 |
| 10000111 | 10 |
| 10001011 | 11 |
| 10001101 | 22 |
| 10001110 | 01 |
| 10010011 | 21 |
| 10010101 | 02 |
| 10010110 | 11 |
| 10011001 | 00 |
| 10011010 | 12 |
| 10011100 | 20 |
| 10100011 | 12 |
| 10100101 | 20 |
| 10100110 | 02 |
| 10101001 | 21 |
| 10101010 | 00 |
| 10101100 | 11 |
| 10110001 | 01 |
| 10110010 | 10 |
| 10110100 | 21 |
| 10111000 | 22 |
| 11000011 | 01 |
| 11000101 | 12 |
| 11000110 | 21 |
| 11001001 | 10 |
| 11001010 | 22 |
| 11001100 | 00 |
| 11010001 | 20 |
| 11010010 | 02 |
| 11010100 | 10 |
| 11011000 | 11 |
| 11100001 | 11 |
| 11100010 | 20 |
| 11100100 | 01 |
| 11101000 | 02 |

TABLE 4

REDUNDANCY AS A FUNCTION OF DATA POLYNOMIAL EVALUATION p, AND 2 USER BITS

| | | user data bus 2 | | | |
|---|---|---|---|---|---|
| p | -p | 00 | 01 | 10 | 11 |
| 00 | 00 | 00110011 | 01010101 | 01100110 | 10011001 |
| 02 | 01 | 00010111 | 00101101 | 01011001 | 01101010 |
| 01 | 02 | 00011011 | 00111100 | 01001110 | 01110001 |
| 20 | 10 | 00011101 | 00101110 | 01011010 | 01100011 |
| 22 | 11 | 00110101 | 01000111 | 01110010 | 10001011 |
| 21 | 12 | 00111001 | 01001011 | 01010110 | 01101100 |
| 10 | 20 | 00101011 | 00110110 | 01001101 | 01111000 |
| 12 | 21 | 00111010 | 01011100 | 01100101 | 10010011 |
| 11 | 22 | 00011110 | 00100111 | 01010011 | 01101001 |

TABLE 5

DESCRIPTION OF FIRST THREE STAGES OF THE ENLARGED 54-STATE TRELLIS FOR ENHANCED 6/8 MSN CODE

| Stage | Initial State (E,F,J) | Next State For Input c = 0 | Next State For Input c = 1 |
|---|---|---|---|
| 1 | (0,0,0) | (0,0,-1) | (1,1,1) |
|   | (0,1,0) | (0,0,-1) | (1,1,1) |
| 2 | (0,0,-1) | (0,0,-2) | (1,1,0) |
|   | (1,1,1) | ($\beta$,0,0) | ($\beta^7$,1,2) |
| 3 | (0,0,-2) | (0,0,-3) | (1,1,-1) |
|   | (1,1,0) | ($\beta$,0,-1) | ($\beta^7$,1,1) |
|   | ($\beta$,0,0) | ($\beta^2$,0,-1) | ($\beta^3$,1,1) |
|   | ($\beta^7$,1,2) | (1,0,1) | ($\beta^4$,1,3) |

We claim:

1. A method of improving reliability of data storage devices that transmit binary data as codewords over a partial response channel, comprising the steps of:

constructing a trellis code with a prespecified algebraic constraint on a predetermined algebraic attribute;

tracking the algebraic attribute for analyzing successive output sequences from the channel to detect a preselected error event;

providing an enlarged detector trellis that includes current state of a channel memory and current state of the algebraic attribute; and adding time-variation to the trellis to remove from the trellis all output sequences that fail to satisfy the prespecified algebraic constraint on the value of the tracked algebraic attribute after the end of each at least one codeword for thereby correcting said error event.

2. The method of claim 1, including the further step of:

for an uncoded partial response channel constructing the trellis to incorporate only the current state of the channel memory and current state of the algebraic attribute.

3. The method of claim 1, including the fur r step of:

for a partial response channel that uses an inner code, constructing the trellis to incorporate current states of the inner code as well as those of the channel memory and the algebraic attribute.

4. A method for improving the reliability of data storage devices by using a code that generates codewords with an algebraic constraint to enable flagging of a preselected error event in output sequences from a detector trellis associated with a partial response channel, comprising the steps of:

selecting an algebraic attribute that will distinguish from one another those of said output sequences that differ by said preselected error event;

constraining allowable channel input sequences to those in said code that restrict the algebraic attribute to a preselected range of values for preventing any pair of output sequences from differing by said preselected error event; and iteratively computing from symbols sequentially output from the trellis the value of the algebraic attribute and after the end of each at least one codeword for flagging violations of the algebraic constraint.

5. The method of claim 4, including, during said constraining step, constraining the allowable input sequences so that they will assume only a single value periodically in time at the end of a prespecified number of said symbols.

6. The method of claim 4, wherein the algebraic attribute is represented as $$t(D) = \sum_{i=0}^{n-1} t_i D^i,$$

where t is a trellis-supported sequence of length n, and D equals an element $\alpha$ in an algebraic system that includes elements that can be multiplied and added.

7. The method of claim 4, wherein the algebraic attribute to identify the error event is represented as $$e(D) = \sum_{i=0}^{n-1} e_i D^i,$$

where $e_1 = c_1 - t_i$, $c_i$ is an encoded sequence of length n, t is a trellis-supported sequence of length n, and an element $\alpha$ is selected in a finite Galois field, such that all values of $e(D)$ for the preselected error event with $D = \alpha$ are other than a preselected value.

8. The method of claim 7, wherein said preselected value is zero.

9. The method of claim 7, wherein the finite field is a smallest one of the finite fields, such that all values of $e(D)$ for the preselected error event with $D = \alpha$ are other than a preselected value.

10. A method for improving the reliability of a data storage device that transmits binary data as codewords over a partial response channel, comprising the steps of:

constraining allowable input sequences of codewords to the channel to those in a trellis code having, after the end of each codeword, a prespecified algebraic constraint on a respective preselected value of an algebraic attribute computed from successive symbols in the codeword; and analyzing the value of the algebraic attribute at the end of each codeword to identify output sequences from the channel that differ from an allowable output sequence by a preselected error event.

11. The method of claim 10, including, during said constraining step, constraining the allowable input sequences so that they will assume only a single value periodically at the end of each time period of prespecified length.

12. A method of improving reliability of data storage devices that transmit binary data as codewords over a partial response channel, comprising the steps of:

constructing a trellis code with a prespecified algebraic constraint on a predetermined algebraic attribute;

tracking the algebraic attribute for analyzing successive output sequences from the channel to detect any one of a plurality of preselected error events;

providing an enlarged detector trellis that includes current states of a channel memory and of the algebraic attribute; and adding time-variation to the trellis to remove from the trellis all output sequences that fail to satisfy the prespecified algebraic constraint on the value of the tracked algebraic attribute after the end of each codeword for thereby correcting any one of said plurality of error events.

13. An apparatus for improving reliability of a data storage device that transmits binary data as codewords over a partial response channel, comprising:

an encoder for constructing from the binary data a trellis code that imposes a prespecified algebraic constraint upon the codewords for permitting detection of a preselected error event; and a detector that generates a most probable binary output sequence from codewords received from the channel and includes circuitry for examining said output sequence for violations of the algebraic constraint and flagging such violations to detect the occurrence of the preselected error event.

14. The apparatus of claim 13, wherein the encoder imposes the algebraic constraint as a predetermined algebraic attribute which identifies output sequences that differ by said preselected error event; and the detector tracks the algebraic attribute to analyze successive output sequences from the channel for detecting the preselected error event.

15. The apparatus of claim 14, wherein the partial response channel uses an inner code and includes a channel memory, and the trellis incorporates current states of the inner code, the channel memory and the algebraic attribute.

16. The apparatus of claim 14, wherein the channel is an uncoded partial response channel that includes a channel memory, and the trellis is constructed to incorporate only a current state of the channel memory and a current state of the algebraic attribute.

17. The apparatus of claim 13, wherein said detector has a trellis which is made time-varying to remove from the trellis all output sequences that fail to satisfy the preselected algebraic constraint for thereby correcting said preselected error event.

18. An apparatus for improving the reliability of a data storage device that transmits binary data as codewords over a partial response channel, comprising:

an encoder including means for imposing on the codewords a prespecified algebraic constraint on the value of an algebraic attribute after the end of each codeword;

a detector including a trellis and a circuit for (i) tracking the value of the algebraic attribute by an iterative computation applied to symbols sequentially output from the trellis, and (ii) analyzing the value of the tracked algebraic attribute after the end of each codeword for flagging violations of the algebraic constraint.

19. The apparatus of claim 18, wherein the channel includes a channel memory, and the trellis is enlarged to include current states of both the channel memory and the algebraic attribute.

20. The apparatus of claim 18, wherein the trellis is made time-varying to remove from the trellis all output sequences that fail to satisfy the prespecified algebraic constraint for thereby correcting said preselected error event.

* * * * *

UNITED STATES PATENT AND TRADEMARK OFFICE
CERTIFICATE OF CORRECTION

PATENT NO. : 5,485,472
DATED : Jan. 16, 1996
INVENTOR(S) : L. Fredrickson

It is certified that error appears in the above-indentified patent and that said Letters Patent is hereby corrected as shown below:

Column 14, line 54, delete "fur r" and add --further--

Signed and Sealed this

Eighteenth Day of June, 1996

Attest:

BRUCE LEHMAN

*Attesting Officer*      *Commissioner of Patents and Trademarks*